(12) United States Patent
Pyi

(10) Patent No.: US 8,022,501 B2
(45) Date of Patent: Sep. 20, 2011

(54) SEMICONDUCTOR DEVICE AND METHOD FOR ISOLATING THE SAME

(75) Inventor: Seung-Ho Pyi, Ichon-shi (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/504,427

(22) Filed: Jul. 16, 2009

(65) Prior Publication Data
US 2009/0278225 A1    Nov. 12, 2009

Related U.S. Application Data

(62) Division of application No. 10/879,757, filed on Jun. 30, 2004, now Pat. No. 7,579,255.

(30) Foreign Application Priority Data

Dec. 29, 2003  (KR) .................................. 2003-98450

(51) Int. Cl.
H01L 21/768   (2006.01)
H01L 21/70    (2006.01)
H01L 23/522   (2006.01)

(52) U.S. Cl. . 257/522; 257/506; 257/528; 257/E21.573; 257/E21.581; 257/E23.142; 438/214; 438/280; 438/319; 438/411; 438/461

(58) Field of Classification Search .................. 438/422, 438/431, 437; 257/510, 522, 647, E21.547, 257/506, 528, E21.573, E21.581, E23.142
See application file for complete search history.

(56) References Cited

U.S. PATENT DOCUMENTS

| 4,356,211 A * | 10/1982 | Riseman | 438/422 |
| 6,251,722 B1 * | 6/2001 | Wei et al. | 438/243 |
| 2002/0167045 A1 * | 11/2002 | Short | 257/330 |

FOREIGN PATENT DOCUMENTS

| JP | 10-041379 | 2/1998 |
| JP | 11-330223 | 11/1999 |
| JP | 2003-142573 | 5/2003 |
| JP | 2003-158177 | 5/2003 |
| JP | 2003-158180 | 5/2003 |

* cited by examiner

Primary Examiner — Zandra Smith
Assistant Examiner — Tsz K Chiu
(74) Attorney, Agent, or Firm — IP & T Group LLP

(57) ABSTRACT

The present invention relates to a semiconductor device and a method for isolating the same. The semiconductor device includes: a silicon substrate provided with a trench including at least one silicon pillar at a bottom portion of the trench, wherein the silicon pillar become sidewalls of micro trenches; and a device isolation layer selectively and partially filled into the plurality of micro trenches.

4 Claims, 6 Drawing Sheets

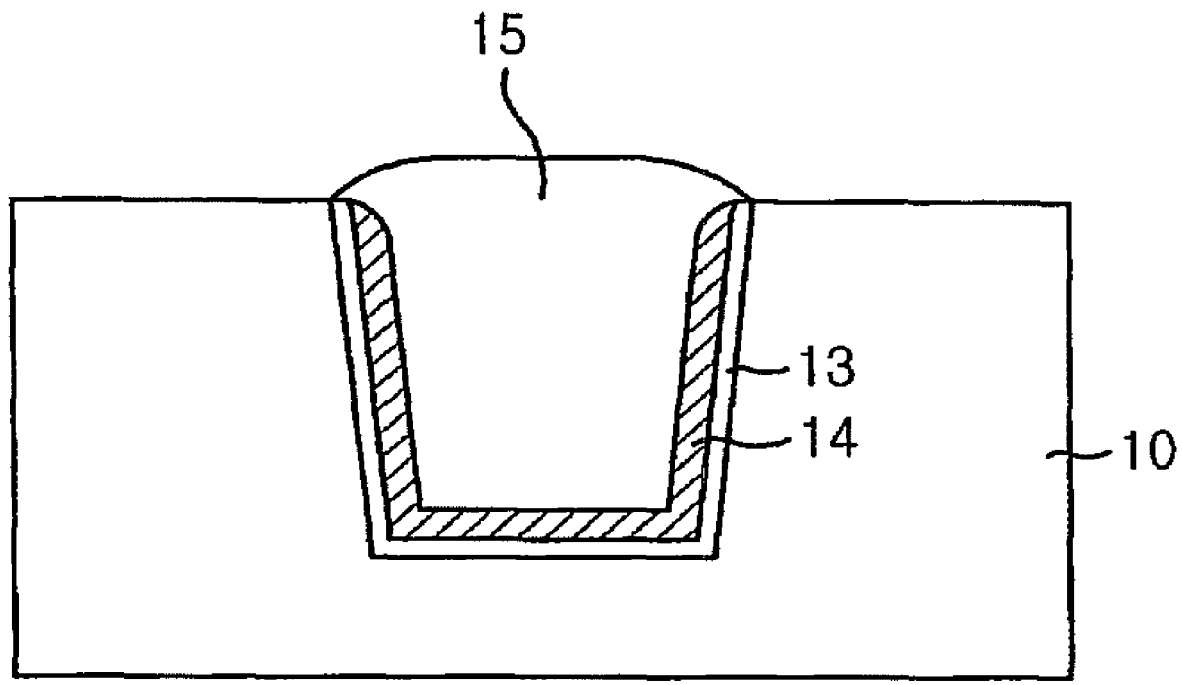

SEMICONDUCTOR DEVICE AND METHOD FOR ISOLATING THE SAME

PRIORITY

This application is a division of U.S. patent application Ser. No. 10/879,757 filed on Jun. 30, 2004, now U.S. pat. No. 7,579,255, which claims priority of Korean patent application number 2003-98450 filed on Dec. 29, 2003. The disclosure of each of the foregoing applications is incorporated herein by reference in its entirety.

FIELD OF THE INVENTION

The present invention relates to a semiconductor device; and, more particularly, to a method for isolating device elements of a semiconductor device by applying a shallow trench isolation process and a semiconductor device provided with a plurality of devices isolated by the method.

DESCRIPTION OF RELATED ARTS

As known, a device isolation technology has been employed to electrically isolate individual device elements such as transistors and capacitors during fabrication of a semiconductor integration circuit. Among various processes of the device isolation technology, a local oxidation of silicon (LOCOS) process and a shallow trench isolation (STI) process are commonly adopted.

The LOCOS method is a method of forming a nitride layer-based mask pattern on an active region of a silicon substrate and thermally oxidating the silicon substrate with use of the mask pattern as a mask. However, the LOCOS method has a disadvantage that a bird's beak phenomenon occurs at an interfacial surface between the oxide layer and the silicon substrate. Thus, it is limited to apply the LOCOS method to highly integrated device elements. As a result of this limitation, the STI method is more widely employed in highly integrated device elements since the STI method forms a device isolation region by forming a shallow trench in a substrate and then burying an oxide layer into the trench.

FIGS. 1A to 1C are cross-sectional views for describing a device isolation method by applying a conventional STI process.

Referring to FIG. 1A, an oxide layer 11 and a nitride layer 12 are sequentially deposited on a substrate 10. The oxide layer 11 and the nitride layer 12 are then patterned by employing an etching process with use of a device isolation mask to thereby make a device isolation region of the substrate 10 exposed. Herein, the oxide layer 11 serves as a buffer layer for preventing generation of stress caused by a direct contact between the substrate 10 and the nitride layer 12. The nitride layer 12 serves as a mask for an etching process for forming a trench and an etch stop layer during a subsequent chemical mechanical polishing (CMP) process.

Next, the exposed substrate 10 is etched to a predetermined depth to thereby form a trench. Then, optionally, a liner nitride layer 14 is formed along the above resulting structure under interposition of a lateral oxide layer 13 on sidewalls of the trench. Herein, the liner nitride layer 14 is formed to improve device characteristics by suppressing a boron segregation phenomenon and prevent induction of stress caused by an additional oxidation of the sidewalls during a subsequent oxidation process. Thereafter, a device isolation layer 15 is deposited on an entire surface of the above substrate structure in a manner to completely fill the trench on which the liner nitride layer 14 is formed. That is, the device isolation layer 15 has a gap-fill property.

Referring to FIG. 1B, the above resulting structure including the device isolation layer 15 is subjected to a CMP process which makes a surface of the nitride layer 12 exposed.

Referring to FIG. 1C, the nitride layer 12 is removed by a wet etching process.

The above described STI process is capable of overcoming limitations of the LOCOS method, and thus, being applicable to highly integrated device elements. Hence, the STI process is the most widely applied device isolation method. However, the STI process still has limitations in its applicability. Particularly, although inside of a device isolation layer, e.g., a trench, should be filled with an insulation layer such as an oxide layer by employing a chemical vapor deposition (CVD) method, it is not easy to fill the trench with the insulation layer through the use of a conventional method due to the decreased widths of device elements to be isolated.

As the width of a trench type device isolation layer decreases, it is highly probable that electric fields from adjacently disposed cells affect other neighboring cells. Thus, scaling down in device integration conversely results in the higher probability that the electric fields from the neighboring cells causes carriers to be inversed along sidewalls of a device isolation layer, and thus further resulting in degradation of refresh characteristic.

Meanwhile, in a sub-0.1 μm dynamic random access memory device (DRAM) technology, a metal shield embedded (MSE)-STI structure is contrived to obtain an effect of shielding electric fields. The MSE-STI structure is formed by filling the trench with polysilicon. Particularly, FIG. 2 shows the MSE-STI structure disclosed in an article by Yongjik Park et. al., entitled "COB Stack DRAM Cell Technology beyond 100 nm Technology Node," *Technology Digest of IEDM*, 391-394 (2001), the entire contents of which being incorporated herein by reference.

With respect to a fabrication process of a device isolation layer, an etch-back process is accompanied to fill a trench with polysilicon. However, after the etch-back process, polysilicon residues are created on sidewalls of a pad nitride layer, degrading device characteristics. Also, it is necessary to form an oxide layer for device isolation on top of the polysilicon after the etch-back process by performing a thermal oxidation process. However, during the thermal oxidation process, the polysilicon expands extensively, and this volume expansion might severely exert stress to the substrate.

SUMMARY OF THE INVENTION

It is, therefore, an object of the present invention to provide a device isolation structure in a semiconductor device capable of preventing leakage current generation caused by an inversion occurring along sidewalls of a device isolation layer and of reducing resistance capacitance (RC) delays by forming a cavity having a small capacitance within a trench.

It is another object of the present invention to provide a method for isolating devices in a semiconductor device capable of easily filling a trench having a high aspect ratio with a device isolation layer, of preventing silicon residues from being generated on sidewalls of a pad nitride layer by filling silicon for shielding an electric field within a trench and of preventing stress exertion caused by a thermal oxidation process.

In accordance with an aspect of the present invention, there is provided a semiconductor device, including: a silicon substrate provided with a trench including at least one silicon pillar at a bottom portion of the trench, wherein the silicon pillar become sidewalls of micro trenches; and a device isolation layer selectively and partially filled into the trench and the plurality of micro trenches.

In accordance with another aspect of the present invention, there is also provided a method for isolating devices of a semiconductor device, including the steps of: forming a primary trench by etching a silicon substrate in a device isolation region; forming at least one secondary trench by etching plural places of the silicon substrate disposed at a bottom surface of the primary trench; and burying a device isolation layer within the primary trench and the secondary trench.

BRIEF DESCRIPTION OF THE DRAWINGS

The above and other object and features of the present invention will become better understood with regard to the following description of the preferred embodiments given in conjunction with the accompanying drawings, in which:

FIGS. 1A to 1C are cross-sectional views for describing a conventional method for forming a device isolation layer in a semiconductor device;

DETAILED DESCRIPTION OF THE INVENTION

Hereinafter, a preferred embodiment of the invention will be described in detail along with the accompanying drawings.

Figure 3:
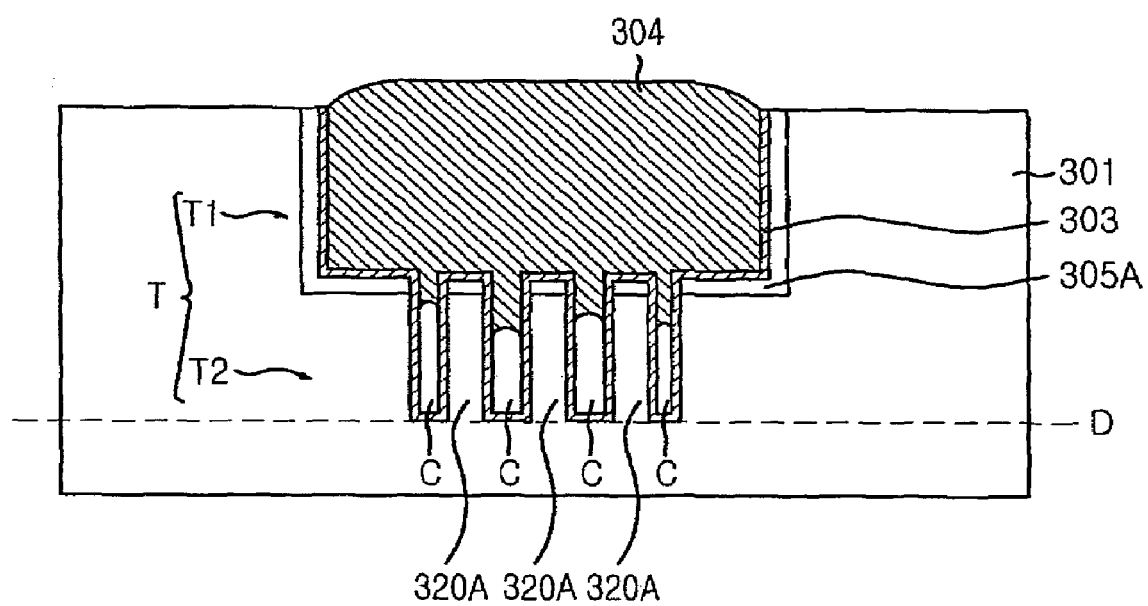
FIG. 3 is a cross-sectional view showing a device isolation structure in a semiconductor device in accordance with a preferred embodiment of the present invention.

FIG. 3 is a cross-sectional view showing a device isolation structure in accordance with a preferred embodiment of the present invention.

As shown, a trench T is formed in a device isolation region of a silicon substrate 301. The trench T includes a primary trench T1 having the same width as that of a designated device isolation region and a plurality of 5 secondary trenches T2 formed at a bottom of the primary trench T1. The primary trench T1 is defined by a device isolation mask and an etching, while the secondary trench T2 is defined by finely etching predetermined regions of the silicon substrate 301 disposed at a bottom surface of the primary 10 trench T1. As simultaneous to the formation of the plurality of secondary trenches T2, a plurality of silicon pillars 320A extended upwardly from a dotted line D become existed between the secondary trenches T2.

A first oxide layer 303 is covered with the inner side surface of the trench T, and a second oxide layer 304 is formed on top of the first oxide layer 303 to fill the trench T. Herein, the first oxide layer 303 is a thermal oxide layer, while the second oxide layer 304 is an oxide layer deposited by a chemical vapor deposition (CVD) method.

Figure 1A:
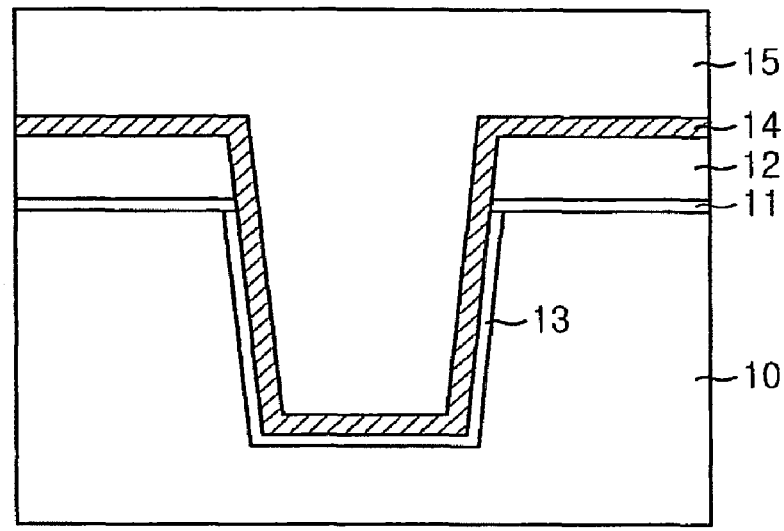
Figure 1B:
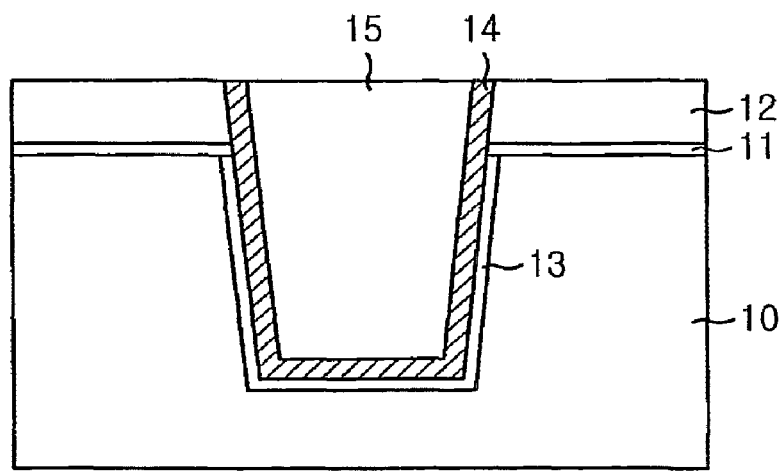
Figure 2:
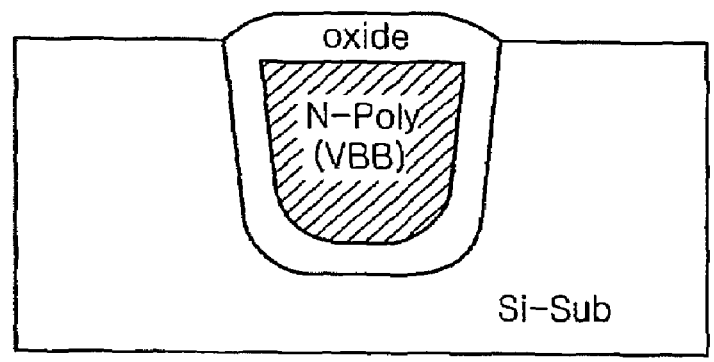
FIG. 2 shows a conventional metal shield embedded-shallow trench isolation (MSE-STI) structure.

As shown, if the silicon pillars 320A exist between the secondary trenches T2, it is possible to have an effect of shielding electric fields as simultaneously as to prevent leakage currents from being generated due to an inversion occurring along sidewalls of a device isolation layer because of an elongated distance between isolated devices. That is, it is possible to attain effects of shielding electric fields and preventing the leakage current generation even within a limited area of an ultra-highly integrated device requiring a fine device isolation structure. Also, since the silicon pillars 320A are not formed through a deposition process and an etch-back process inside of trench T, it is possible to solve a problem in silicon residue generation as described in FIG. 2.

Since the width of each secondary trench T2 is very small, the second oxide layer 304 is not completely filled thereinto. As a result, there is formed a plurality of cavities C. This cavity C has a very small capacitance, and thus, resulting in an effect of reducing a capacitance that causes resistance capacitance (RC) delays. The cavities C can be formed only in a partial number of the secondary trenches T2. In addition, it is easier to fill the trench T with the second oxide layer 304 since it is not necessary to completely fill the secondary trenches T2.

Because a conducting layer such as a polysilicon layer is not used for filling the trench in this preferred embodiment, there is no necessity for performing a thermal oxidation process after the trench-filling process. Therefore, it is possible to prevent stress induction caused by the thermal oxidation performed after the trench-filling process.

FIGS. 4A to 4F are cross-sectional views for describing a method for isolating device elements of a semiconductor device in accordance with the preferred embodiment of the present invention.

Figure 4A:
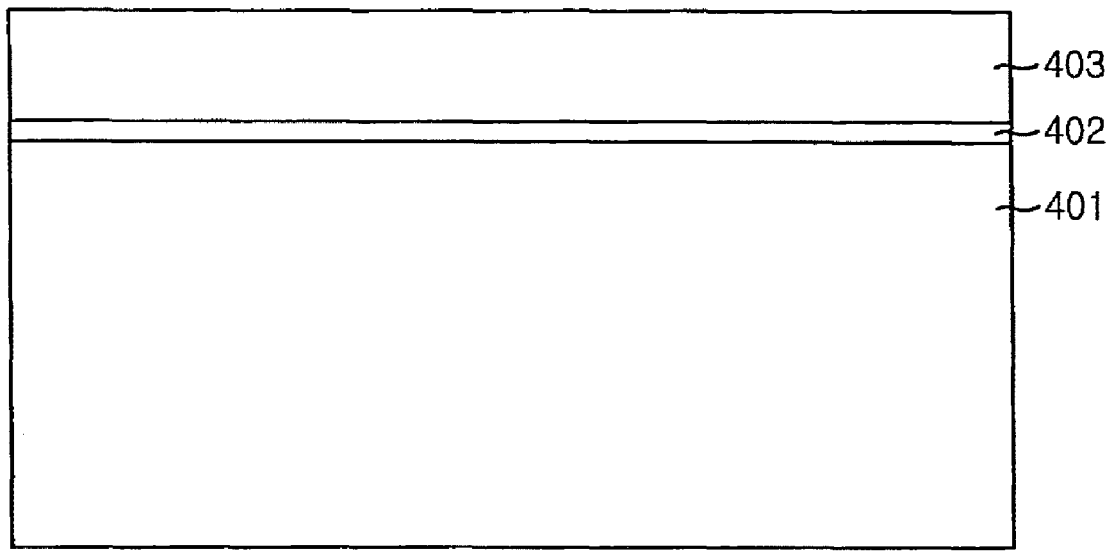
FIGS. 4A to 4F are cross-sectional views for describing a method for isolating device elements of a semiconductor device in accordance with the preferred embodiment of the present invention.

Referring to FIG. 4A, a buffer oxide layer 402 and a pad nitride layer 403 are sequentially formed on a silicon substrate 401 to be used as an etch mask for use in an etching process for forming a trench and as an etch stop layer during a chemical mechanical polishing (CMP) process.

The buffer oxide layer 402 plays a role in reducing a stress created by a direct contact made between the silicon substrate 401 and the pad nitride layer 403. Although the preferred embodiment exemplifies the buffer oxide layer 402 formed in only one layer, it is still possible to form a stack of layers of polysilicon and oxide and an oxy-nitride layer for the same purpose. Also, it is possible to omit the formation of the buffer oxide layer 402. Also, in addition to the use of a silicon wafer, the substrate 401 can be formed of a silicon epitaxial layer without departing from the scope and sprit of the present invention.

Figure 4B:
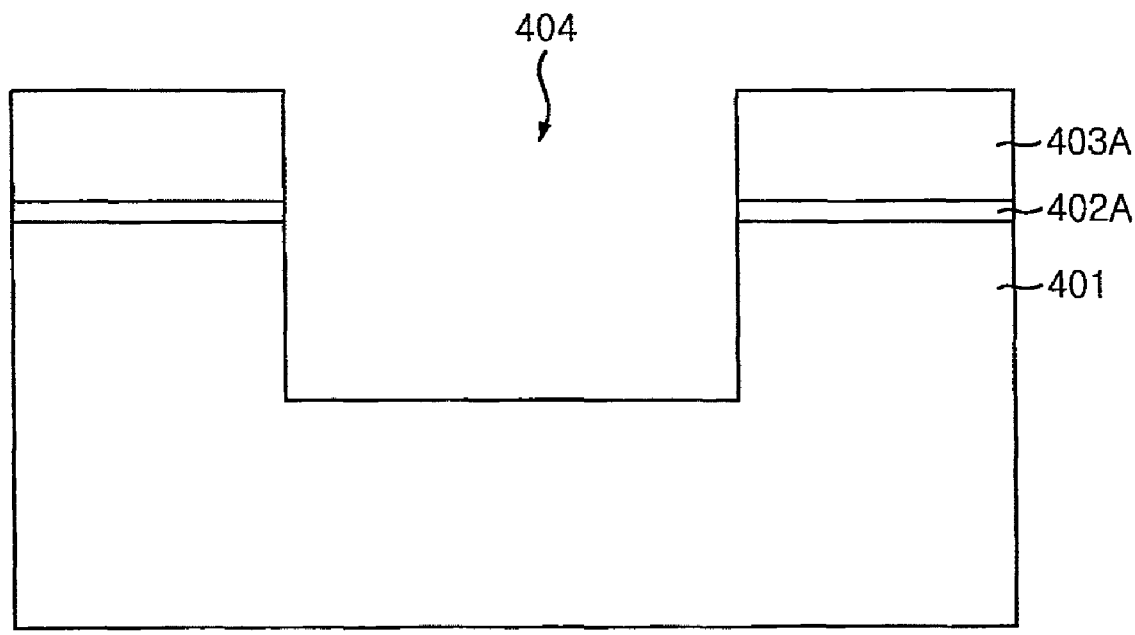

The pad nitride layer 403 and the buffer oxide layer 402 are patterned by performing a lithography process with use of a device isolation mask, thereby obtaining a patterned pad nitride layer 403A and a patterned buffer oxide layer 402A as shown in FIG. 4B. The silicon substrate 401 is then etched to a predetermined depth by using the patterned pad nitride layer 403A as an etch mask. From this etching, a primary trench 404 is formed. In accordance with the preferred embodiment of the present invention, the depth and the width of the primary trench 404 is formed in consideration of the total intended depth of the finally formed trench.

In more detail of the formation of the primary trench 404, a photoresist is coated on the pad nitride layer 403 and is patterned by performing a photo-exposure and developing process with use of the device isolation mask. Then, the pad nitride layer 403 and the buffer oxide layer 402 are etched by using the photoresist pattern as a mask. This etching continues until a portion of the silicon substrate 401 is etched by using the patterned pad nitride layer 403A as an etch mask. Thereafter, the remaining photoresist pattern is removed.

Figure 4C:
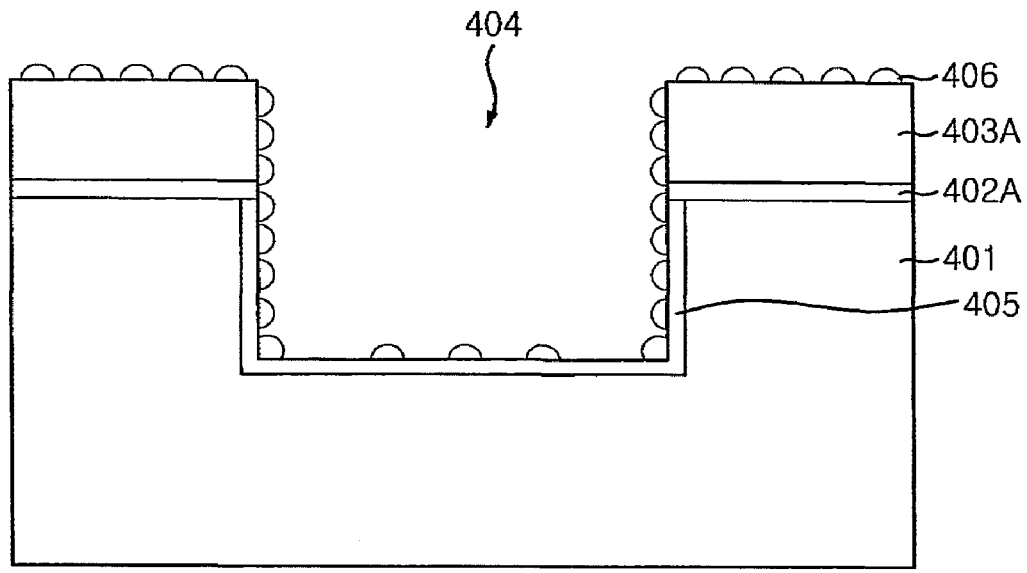

Referring on to FIG. 4C, a first oxide layer 405 is formed on inner walls of the primary trench 404 by performing a thermal oxidation process. Hemispherical silicon grains (HSG) 406 are formed on the above resulting structure. The first oxide layer 405 serves as an etch mask for forming a secondary trench. In addition to the use of oxide for being used as the etch mask, it is still possible to use a thin layer having a different etch selectivity from silicon. Examples of such thin layer are an oxide layer and a stack layer of nitride and oxide.

Figure 4D:
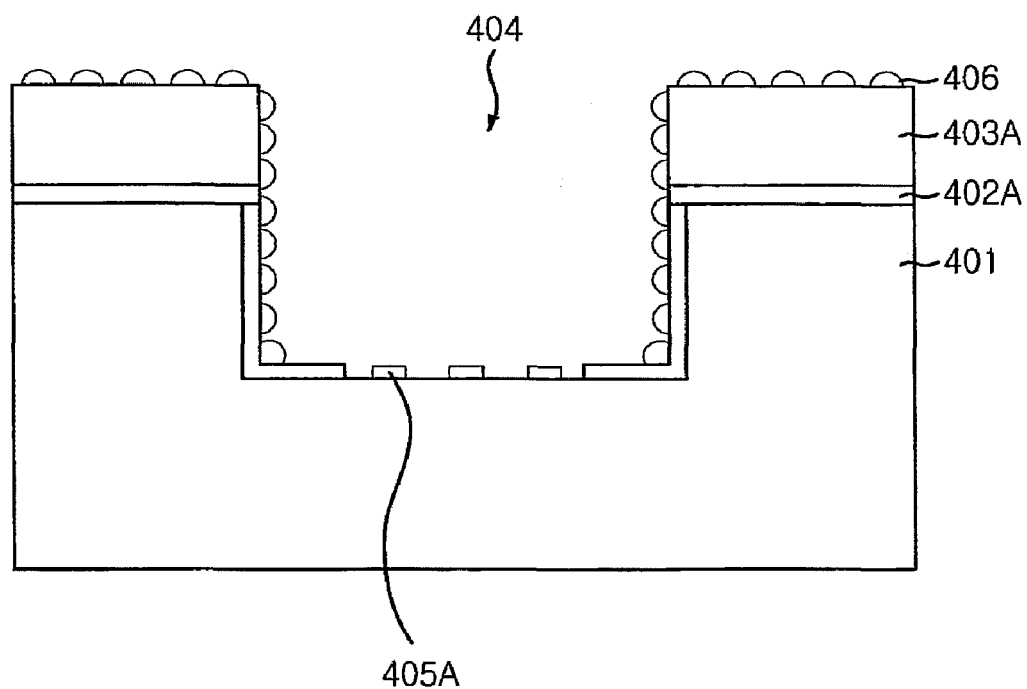

Referring to FIG. 4D, an anisotropic etching process is performed to etch the first oxide layer 405 by using the HSG 406 as a mask. More specifically, the first oxide layer 405 disposed on a bottom surface of the primary trench 404 is locally etched at several regions to thereby form a first oxide layer pattern 405A. Geometrically, the HSG 406 has groove parts corresponding to grain boundaries and mounted parts corresponding to silicon grains, and the first oxide layer 405 is etched at the groove parts.

Figure 4E:
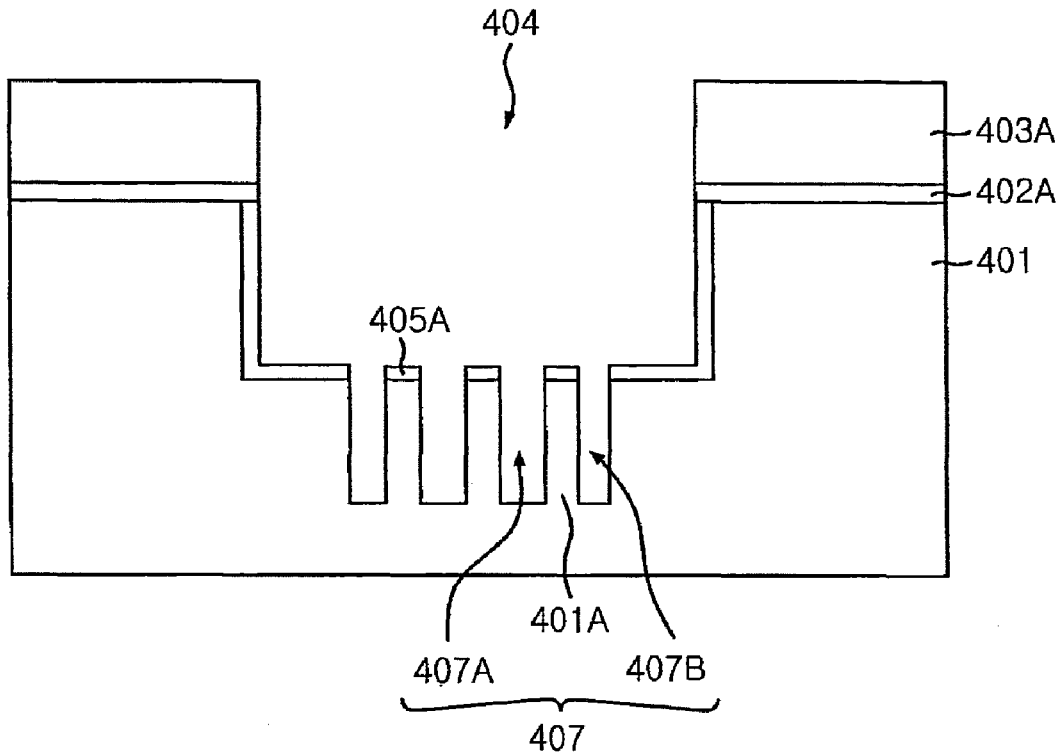

Referring to FIG. 4E, the silicon substrate 401 exposed at the bottom surface of the trench 404 is then etched by using the first oxide layer pattern 405A as a mask. From this etching, a plurality of secondary trenches 407 and a plurality of silicon pillars 401A disposed between a first secondary trench 407A and a second secondary trench 407B are formed.

Figure 4F:
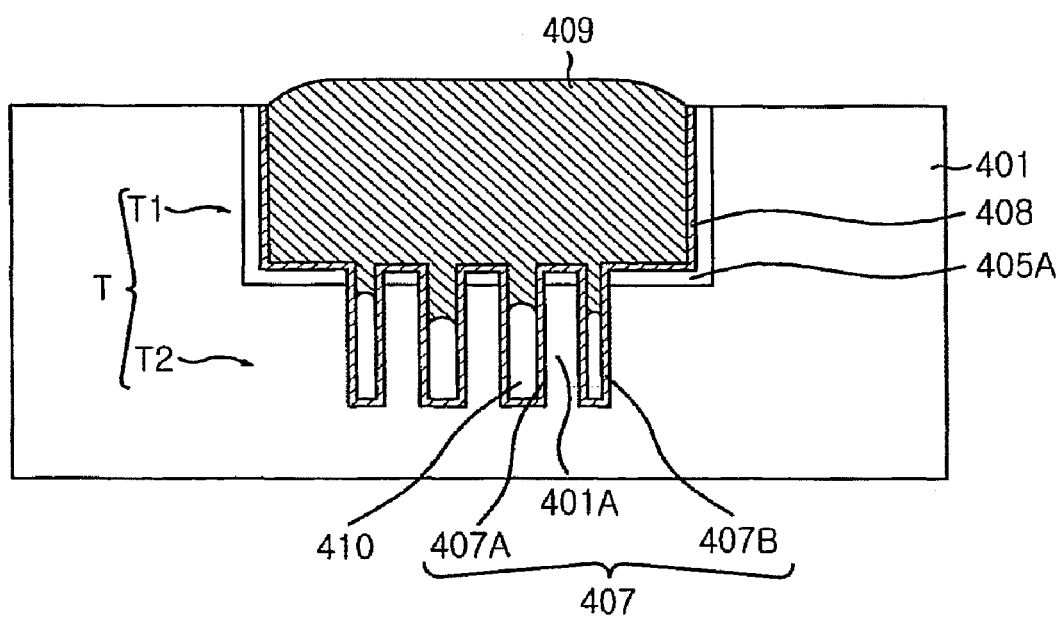

Referring to FIG. 4F, a second oxide layer 408 is thinly grown along a trench profile by carrying out a thermal oxidation process. Afterwards, a third oxide layer 409 is filled into the primary trench 404 and the secondary trenches 407 by employing a CVD method. Thereafter, conventionally performed processes such as a CMP process and a removal of the patterned pad nitride layer 403A proceed to complete the formation of the device isolation layer.

Since the secondary trenches 407 have a fine structure, in accordance with the preferred embodiment of the present invention, the third oxide layer 409 partially fills each of the secondary trenches 407, thereby forming a plurality of cavities 410. Especially, the CMP process continues until a surface of the patterned pad nitride layer 403A is exposed. Subsequent to the CMP process, the patterned pad nitride layer 403A is removed by being dipped into a wet etching solution for use in a removal of a nitride layer. For instance, phosphoric acid ($H_3PO_4$) is an example of such wet etching solution.

Although FIG. 3 and FIGS. 4A to 4F show three of the silicon pillars 401A, the number of the silicon pillars is not important but it should be noted that there exists at least one silicon pillar disposed between the secondary trenches. As a result, it is possible to provide an effect of shielding electric fields. Also, a distance between isolated devices is elongated and thus, it is possible to prevent the leakage current generation caused by an inversion occurring along sidewalls of the trench even in a very highly integrated device.

In addition, the cavity formation caused by an incomplete filling of the secondary trenches provides an additional effect of decreasing a capacitance. Furthermore, since it is necessary to completely fill only the primary trench with the oxide layer for use in the device isolation, i.e., the third oxide layer in this preferred embodiment, a depth of a hollow to be filled is also decreased, thereby easing the burial of the oxide layer for use in a device isolation layer.

The present application contains subject matter related to Korean patent application No. KR 2003-0098450, filed in the Korean Patent Office on Dec. 29, 2003, the entire contents of which being incorporated herein by reference.

While the present invention has been described with respect to certain preferred embodiments, it will be apparent to those skilled in the art that various changes and modifications may be made without departing from the scope and spirit of the invention as defined in the following claims.

What is claimed is:

1. A semiconductor device, comprising:
  a silicon substrate provided with a primary trench and micro trenches having sidewalls formed by at least one silicon pillar, wherein the at least one silicon pillar is formed at a bottom portion of the primary trench; and
  a device isolation layer filling the primary trench,
  wherein the micro trenches are filled by the device isolation layer partially so that the micro trenches are not completely filled by the device isolation layer and at least one cavity is formed inside the micro trenches.

2. The semiconductor device of claim 1, wherein the device isolation layer includes an oxide layer formed by employing a chemical vapor deposition method.

3. The semiconductor device of claim 1, wherein the at least one silicon pillar is formed at a region of the silicon substrate below the bottom portion of the primary trench.

4. The semiconductor device of claim 1, wherein the primary trench is completely filled by the device isolation layer.

* * * * *